United States Patent [19]

Keren et al.

[11] Patent Number: 4,833,429
[45] Date of Patent: May 23, 1989

[54] QUADRATURE COMBINER

[75] Inventors: Hanan Keren, Kfar Saba; Itzchak Linenberg, Netanya, both of Israel

[73] Assignee: Elscint, Ltd., Haifa, Israel

[21] Appl. No.: 194,974

[22] Filed: May 17, 1988

[30] Foreign Application Priority Data

May 29, 1987 [IL] Israel .......................................... 82716

[51] Int. Cl.[4] .......................... G01R 33/20; H01P 1/18; H01P 5/04
[52] U.S. Cl. ..................................... 333/156; 324/318; 324/322; 333/160
[58] Field of Search ............... 333/139, 156, 157, 160, 333/161, 164, 219, 24 R, 27, 101, 138–139, 104–106; 324/309–312, 318, 322

[56] References Cited

U.S. PATENT DOCUMENTS

| | | | |
|---|---|---|---|
| 3,131,367 | 4/1964 | Pitts et al. | 333/164 |
| 3,781,722 | 12/1973 | Pierson | 333/156 |
| 4,682,128 | 7/1987 | Sproul et al. | 333/156 X |
| 4,684,895 | 8/1987 | Misic | 333/104 |

OTHER PUBLICATIONS

Chen, C. N. et al., "Quadrature Detection Coils-A Further √2 Improvement in Sensitivity", *Journal of Magnetic Resonance*, vol. 54, pp. 324–327 (1983).

Primary Examiner—Marvin L. Nussbaum
Attorney, Agent, or Firm—Sandler & Greenblum

[57] ABSTRACT

A quadrature coil combiner for phase shifting the pulses and signals of a quadrature coil system used in magnetic resonance (MR) systems to selectively combine or cancel the pulses and signals transmitted and received. The combiner comprises a first and a second conductor for coupling a first and a second coil respectively of the quadrature coil system to a transmit-receive circuit of the MR system. The first conductor comprises an insertable $\pi/2$ radian delay. The second conductor includes a fixed $\pi/2$ radian delay. At least one of either the fixed delay or the insertable delay is a quarter wavelength cable whereby active elements are minimized.

6 Claims, 1 Drawing Sheet

QUADRATURE COMBINER

FIELD OF THE INVENTION

This invention has to do with quadrature combiners used in combining signals and pulses received from and transmitted to quadrature radio frequency (RF) coils used in magnetic resonance (MR) systems.

BACKGROUND OF THE INVENTION

Some time ago it was discovered that quadrature coils that is, polar coils, enable improving the sensitivity of the MR systems by a factor of at least the square root of two. With the usual linear coils, use is made of only half of the radiated energy, while quadrature coils enable using all of the radiated energy. Accordingly, the use of quadrature coils has increased.

For an example of quadrature coils, see the patent application filed in Israel on 20 February, 1986, which received Serial No. 77937 and was subsequently filed in the United States where it issued on July 12, 1988, as U.S. Pat. No. 4,757,290.

The invention of that Application is assigned to the assignee of the invention of this Application. The sensitivity improvement afforded by quadrature coils is described in an article entitled "Quadrature Detection Coils—A Further $\sqrt{2}$ Improvement in Sensitivity", which appeared in the Journal of Magnetic Resonance, Volume 54, pp. 324–327 (1983). The article points out how the improvement in sensitivity occurs and provides two examples of quadrature combines for use in combining the signals received from each of the quadrature coils, i.e., coils that are orthogonal to each other. The quadrature combines phase shift signals or pulses received or transmitted by the quadrature coils to combine the quadrature signals and effect the improvement in sensitivity.

The prior art quadrature combines included a plurality of either active elements such as switches or diodes and/or a plurality of inductors and capacitors.

Using a multiplicity of active elements over which the signal to and from the quadrature coil flows of course decreases the reliability of the system. The plurality of elements, active and inactive used in the prior art also increases the cost of the prior art transmitting and receiving systems.

BRIEF DESCRIPTION OF THE INVENTION

Accordingly, it is an object of the present invention to simplify the prior art quadrature combiner circuitry. Therefore, a quadrature combiner for phase shifting the pulse/signals of a quadrature coil system to selectively combine or cancel the pulse/signal transmitted or received by said quadrature coil system is provided, said quadrature combiner comprising:

first conductor means for coupling the first coil of said quadrature coil system to a transmit-receive circuit of an MR system, second conductor means for coupling said second coil of said quadrature coil system to said transmit-receive circuit of said MR system, said second conductor means comprising fixed delay means for delaying said pulses/signals $\pi/2$ radians, said first conductor means comprising insertable delay means for delaying said pulses/signals $\pi/2$ radians, means for selectively inserting or not inserting said insertable delay means of said first conductor, and at least one of said fixed delay means or said insertable delay means comprising one-quarter wavelength ($\pi/4$) cable means.

Herein, the pulses and signals are sometimes generically referred to as "information indications" and the receivers and transmitters are generically referred to as "information-transfer circuit means".

According to a feature of the invention both the fixed delay means of the second conductor and the insertable delay means of the first conductors comprise $\pi/4$ cable means.

According to yet another feature of the invention the delay means of said first conductor comprises a series pair of $\pi/4$ cable means.

According to yet another feature of the invention said means for selectively inserting or not inserting said delay means of said first conductor comprises switch means for switching said $\pi/4$ cable means in and out of the circuit.

According to a related feature of the present invention the switch means comprises:

a pair of switches, said $\pi/4$ cable means comprising a first $\pi/4$ cable in series with a second $\pi/4$ cable and a third $\pi/4$ cable bridging an open section in said second conductor, said pair of switches including:

a first switch and a second switch which are both normally open, said first switch being in series in the first conductor, and bridged by the series combination of the first and second $\pi/4$ cable, so that when said first and said second switches are open the signals from the coil means flow through the series combination of $\pi/4$ cable means, the second switch connecting the junction point of the first and second $\pi/4$ cables to ground, the first and second switches are opened during receiving and are closed during transmitting, whereby during transmission, the pulses do not flow through the first and second $\pi/4$ cables of the first conductor but instead flow through the first switch, because the short to ground caused by the second switch is presented as an open at the coupling point of the first $\pi/4$ cable section to the first conductor and thus precludes the flow of current through the first and second $\pi/4$ cables; since, the pulses go through the third $\pi/4$ cable, the pulses to the second coil lag the pulses connected to the first coil by 90 degrees or $\pi/2$ radians; this lag compensates for the physical displacement of the quadrature coils.

According to yet another feature of the present invention the switch means comprise pin diode switching circuitry. Means are provided for applying bias voltage to the pin diodes to cause current to flow through the pin diodes and means are provided for removing the bias voltage from the pin diodes to stop current flow through the pin diodes and thus return the switches to their normal open condition.

BRIEF DESCRIPTION OF THE DRAWINGS

The above named and other features and objects of the present invention will be better understood when considered in he light of the following description of a preferred broad embodiment of the present invention made in conjunction with the accompanying drawings; wherein.

GENERAL DESCRIPTION

Figure 1:
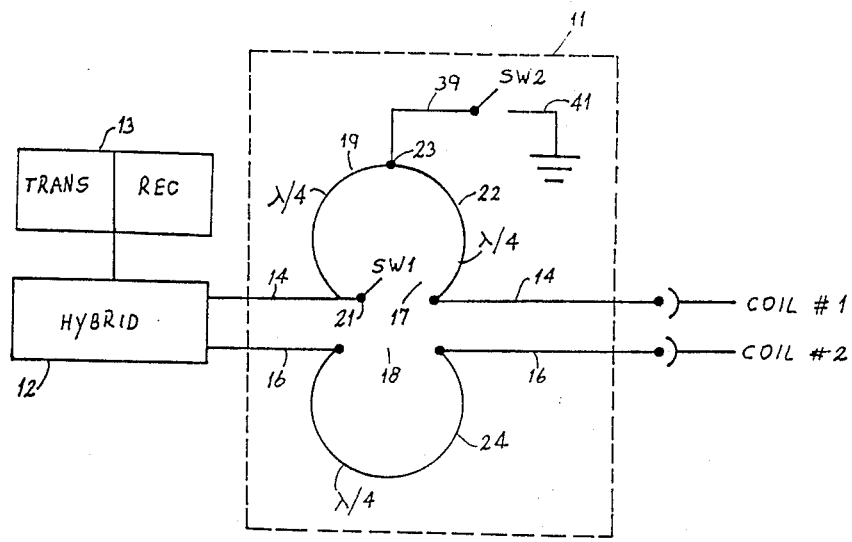
FIG. 1 is a block and schematic showing of a quadrature combiner coupled to the transmitter-receiver through a hybrid network.

FIG. 1 at 11 shows a quadrature combiner, the quadrature combiner is coupled to coil 1 and coil 2 of quadrature coils, (not shown). The other side of the quadrature combiner is coupled to hybrid circuitry 12. The hybrid circuitry, in a preferred embodiment, may be the same hybrid circuit which is shown in the patent application which was filed in Israel on Nov. 1, 1985 and received the Ser. No. 76912 and subsequently filed in the United States where it issued on September 23, 1986, as U.S. No. 4,613,837.

The other side of the hybrid circuit is connected to a transceiver arrangement 13. The transceiver arrangement provides pulses for transmission in the magnetic resonance system and receives signals from the patient which are picked up by the quadrature coils for data acquisition.

The inventive quadrature combiner arrangement generally comprises a first conductor shown as conductor 14. Conductor 14 is connected between the hybrid network 12 and coil number 1. A second conductor 16 is also connected between the hybrid circuit 12 and coil number 2. The conductors 14 and 16 have open sections 17 and 18 respectively. Open section 17 of coil 14 has a switch means thereacross indicated as switch SW1. In addition, the open section of conductor 14 is bridged by a series pair of quarter wavelength long cable sections. More particularly a first quarter wavelength cable section 19 is connected to first conductor 14 at point 21 adjacent to the opening 17 and on one side of the switch SW1. A second quarter wavelength cable section 22 is coupled to quarter wavelength cable section 19 at point 23 and is also connected to cable 14 on the coil side of opening 17 and to switch SW 1.

The junction point 23 is connected to ground through a second switch means SW2. Thus when switch SW2 is closed, junction point 23 is shorted to ground.

The second conductor 16 has opening section 18 bridged by a quarter wavelength cable section 24. Note that there is no switch over the opening 18 so that any current flowing on conductor 16 must flow through quarter wavelength section 24.

It is well known that a quarter wavelength cable section provides a phase delay of $\pi/2$ radians or 90 degrees. Thus, when switches SW1 and SW2 are closed and pulses are being transmitted from transmitter-receiver circuitry 13, through the hybrid 12 to each of the quadrature coils. Then the pulses from the first conductor 14 lead the pulses in the second conductor 16 by 90 degrees (which is the phase lag introduced by the quarter wavelength section 24). There are no pulses flowing in the series combination of quarter wavelength sections 19 and 22 when switches SW1 and SW2 are closed because switch SW2 introduces a short circuit at poin 23. A quarter wavelength section such as sections 19 and 22 which are shorted at one end, appear to be open at the other end thereof (when the pulses are of the frequency f corresponding to $\lambda$. Thus, at point 21 it appears to the pulses in the second conductor as if the quarter wavelength section 19 is open and the current instead flows through switch SW 1. During transmission both switches SW1 and SW2 are both closed.

During receiving both switches SW1 and SW2 are open. When switches SW1 and SW2 are open then any current flowing in conductor 14 from quadrature coil 1 flows through both quarter wavelength sections 22 and 19. A $\pi/2$ radians delay is caused by the quarter wavelength section 22. In addition a quarter wavelength delay (or $\pi/2$ radians delay) is caused by quarter wavelength section 19. The summation of the delays therefore is $\pi$ radians or 180 degrees. Therefore, coil number 1 is delayed by 180 degrees. The signal from coil number 2 goes through quarter wavelength cable section 24 and is delayed by 90 degrees. The net result is a delay of 90 degrees or $\pi/2$ radians between the signal on coil number 1 and the signal on coil number 2. The $\pi/2$ radians of delay on each of the series $\pi/4$ wavelength sections enables proper summing of both quadrature coil signals.

Figure 2:
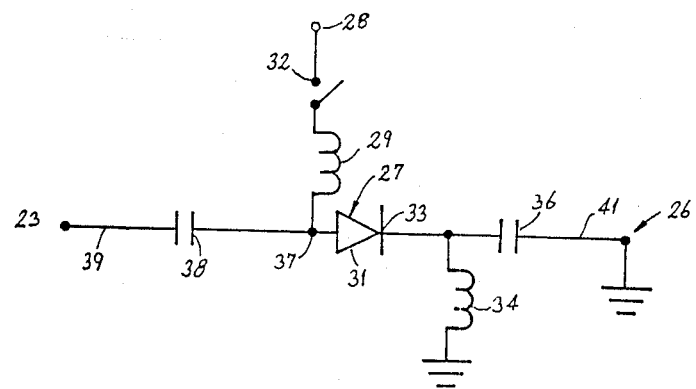
FIG. 2 shows a typical pin diode switching circuit for use as the switches in the quadrature combiner circuit of FIG. 1.

In a preferred embodiment the switches SW1 and SW2 are provided by pin diodes. A pin diode switch arrangement is shown in FIG. 2. More particularly, pin diode switch arrangement (which is used for both switch 1 and switch 2 in a preferred embodiment) is shown generally at 26 in FIG. 2. It is comprised of a pin diode 27 coupled to a switchable bias source nominally at 5 volts. Any type of switch can be used between the five volts supply shown at 28 and the coil 29 connected to the anode of the pin diode 31. The switch means indicated at 32 in a preferred embodiment is a transistor type switch operated by the system controller/processor, not shown. The cathode 33 of the pin diode 27 is shown connected to ground through an inductor coil 34 and connected to (coil number 1, (SW1) or ground (SW2) through capacitor 36 and conductor 41. The anode 31 is conected to the junction 37 of the coil 29 and capacitor 38. The other plate of capacitor 38 is connected through conductor 39 to junction point 21 or 23. The pin diode switches SW1 and SW2 both use similar operating circuits.

Thus a quadrature combining circuit is provided which is used to combine the signals received on the quarature coils number 1 and 2. The circuit provides proper phase shifts to enable the signals/pulses of coil number 1 and coil number 2 to be combined without suffering phase losses. In operation switch SW1 and switch SW2 are both open during receiving and are both closed during transmission. During transmission when they are both closed, then the pulses are applied to coil number 1 without any phase delay. However, the pulses are applied to coil number 2 with a 90 degree phase delay. Thus, the quadrature circuit arrangement accounts for the orthogonal displacement of the coils by phase shifting and combining to provide a single unitary combined signal which increases the received and transmitted signals and pulses, respectively. Among other benefits, this enables the use of lower power during the transmission sequence to assure that the MR system meets the power deposition specification.

During the receiving phase of the operation, both switches SW 1 and SW2 are open and signals are received from coil 1 and coil 2. Since the coils are in quadrature, the signals are received 90 degrees out of phase. However, the signal from coil number 1 is forced through a pair of quarter wavelength cable sections in series and is therefore delayed by 180 degrees. The signal from coil number 2 goes through a single quarter wavelength cable section and is delayed by 90 degrees.

When the switches are open, the current goes through the quarter wavelength cables 19 and 22 and, therefore, there is no voltage stress on the pin diodes even when transmitting relatively high power pulses.

Accordingly, the delay between the two signals accounts for the quadrature displacement of the two coils and the received signals are combined to improve the sensitivity of the system. The operation of the quadrature combiner is simplified by the use of the quarter wavelength sections and the pin diode type switches.

While the system has been described using an exemplary embodiment it should be understood that the exemplary embodiment is described by way of example only and not as a limitation on the scope of the invention.

What is claimed is:

1. A quadrature combined for selectively phase shifting quadrature coil information indications of a quadrature coil system, the quadrature coil information indications comprising transmitted pulses and received signals, said quadrature coil system having a first coil and a second coil orthogonically displaced from said first coil said quadrature combiner used in magnetic resonance (MR) data acquisition apparatus to selectively combine the said quadrature coils system information indications during pulse transmissions or signal receptions by said quadrature coil system, said quadrature combiner comprising:

first conductor means for coupling said first coil of said quadrature coil system to an information indications transfer circuit means of said MR data acquisition apparatus, said first conductor means comprising insertable delay means for delaying said information indications 180 degrees, second conductor means for coupling said second coil of said quadrature coil system to said information indications transfer circuit means, said second conductor means comprising fixed delay means for delaying said information indications 90 degrees, switch means for selectively inserting said insertable delay means into said first conductor means during signal reception or not inserting said insertable delay means in said first conductor means during pulse transmission to cause said pulses or said signals to combine, said insertable delay means being inserted by opening said switch means and not inserted by closing said switch means, said insertable delay means comprising a series combination of quarter wave length cable means, and said switch means providing a current path around said insertable delay means during pulse transmission whereby said switch means are not under voltage stress during transmission when subjected to relatively high power.

2. The quadrature combiner of claim 1 wherein said information indications transfer circuit means comprises transmit circuitry for transmitting RF pulses to a patient.

3. The quadrature combiner of claim 1 wherein said information indications transfer circuit means comprises receive circuitry for receiving signals from a patient.

4. The quadrature combiner of claim 1 wherein said fixed delay means comprises quarter wavelength ($\pi/4$) cable means.

5. The quadrature combiner of claim 4 wherein said switch means comprises a pair of switches, a first switch of said pair of switches being coupled across an opening in said first conductor means.

6. The quadrature combiner of claim 5 wherein a second switch of said pair of switches is coupled between the coupling point of said first and second quarter wavelength cable means and ground to cause said first quarter wavelength cable to appear as an open circuit and thereby prevent grounding of the transmitted pulse.

* * * * *